United States Patent [19]

Adam

[11] Patent Number: 4,881,642
[45] Date of Patent: Nov. 21, 1989

[54] ELECTROSTATIC CHARGE DISSIPATOR AND METHOD OF MAKING

[76] Inventor: William D. Adam, 1822 1/2 Newport Blvd., #347, Costa Mesa, Calif. 92627

[21] Appl. No.: 283,146

[22] Filed: Dec. 8, 1988

[51] Int. Cl.$^4$ ............................................. B65D 73/02
[52] U.S. Cl. ..................................... 206/328; 206/334; 174/36; 428/511
[58] Field of Search ............... 174/36, 35 R; 206/328, 206/334, 8; 428/511, 35, 424.8, 500, 507, 512, 910

[56] References Cited

U.S. PATENT DOCUMENTS

| | | | |
|---|---|---|---|
| 4,706,438 | 11/1987 | Ohlbach | 206/328 |
| 4,707,414 | 11/1987 | Long et al. | 428/511 |
| 4,712,674 | 12/1987 | Young | 206/328 |

*Primary Examiner*—Joseph Man-Fu Moy
*Attorney, Agent, or Firm*—Fulwider, Patton, Lee & Utecht

[57] ABSTRACT

An electrostatic charge dissipator made of extruded sheet material in flat form or thermoformed into a shipping container or the like. The sheet material comprises a relatively thick, high strength, electrically nonconductive substrate and a relatively thin electrically conductive layer fused to one or both faces of the substrate. The layer includes a dispersion of electrically conductive particles, flakes or fibers. The substrate and conductive layer are connected together by an electrical conductor such that the laminate is effectively electrically conductive throughout to thereby carry off accumulated static charges. Various methods are disclosed for integrally fusing the substrate and layer or layers.

9 Claims, 2 Drawing Sheets

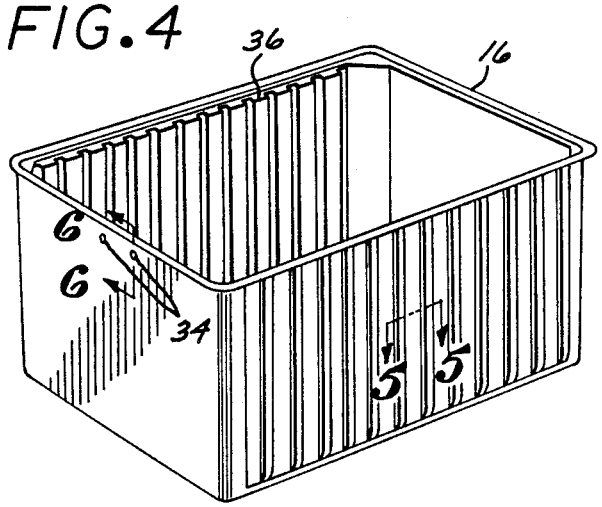
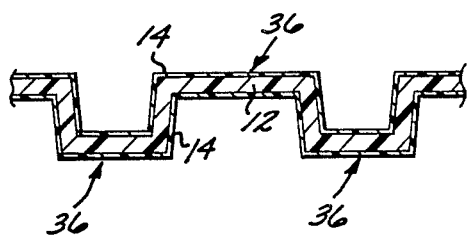
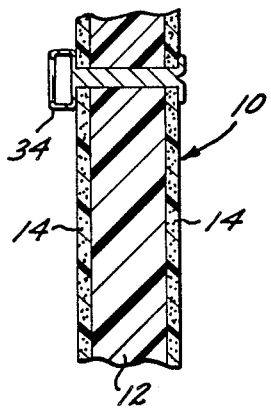
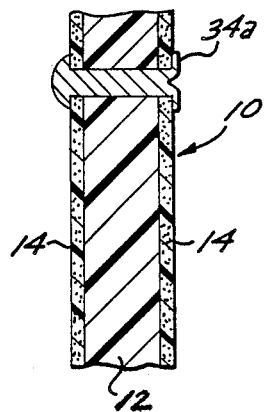
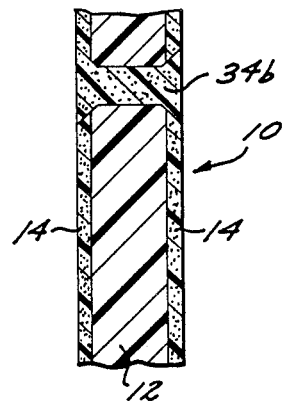
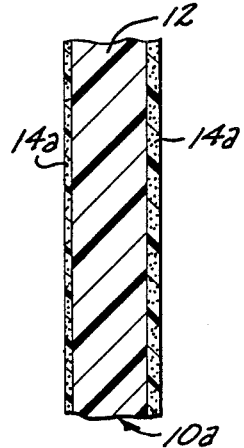
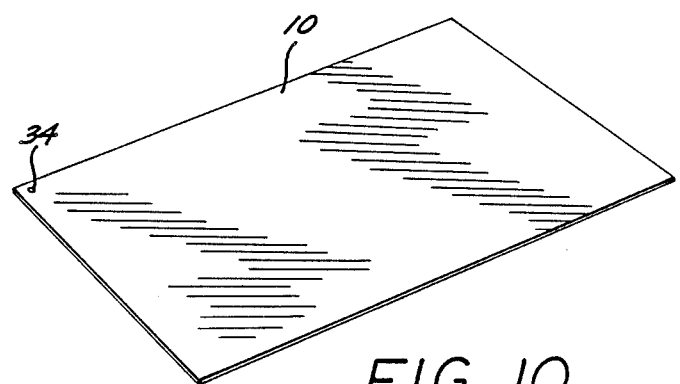

ELECTROSTATIC CHARGE DISSIPATOR AND METHOD OF MAKING

BACKGROUND OF THE INVENTION

Field of the Invention

The present invention relates to electrostatic charge dissipators made of extruded sheet material in flat form or thermoformed into containers or the like for holding electronic parts.

DESCRIPTION OF THE RELATED ART

The buildup and accidental transfer of static electricity to magnetic recording equipment or electronic parts can be destructive. The relatively high voltage levels involved are capable of erasing magnetically recorded data or destroying component parts of printed circuit boards and the like.

Electrically conductive floor pads are used by computer operators and persons handling electronic equipment to carry away such static electricity before it can do harm. Shipping containers for electronic parts are also fabricated of electrically conductive sheet materials for the same reason. Such pads, containers and analogoue components are not usually electrically conductive because they are made of non-conductive thermoplastic resins. However, they can be rendered conductive by embedding electrically conductive wires in the parent material, by applying metallic foil to the component surfaces, by painting, coating or plating a thin layer of conductive material on the component surfaces, or by disbursing conductive carbon or metal particles or flakes throughout the parent material.

Embedding wires is relatively expensive, and externally applied layers of foil or coatings of conductive material are susceptible to damage. Although disbursing conductive particles throughout the parent material is effective, the technique has certain disadvantages. The extrudable thermoplastic resin used for making high strength shipping containers and the like is typically a high density polyethylene or acrylonitrile bytadiene styrene, polypropylene, polystyrene or the like. Inclusion of carbon particles or other conductive fill provides the desired electrical conductivity for electrostatic charge dissipation, but this is relatively expensive and the presence of the inclusions adversely affects the ease of extruding and thermoforming the material. Further, certain physical properties of the thermoplastic sheet material are adversely affected, such as the melt strength of the material. Consequently, use of plastic material with carbon inclusions requires the use of thicker sections to provide the same strength as unimpregnated plastic material.

SUMMARY OF THE INVENTION

According to the present invention, an electrostatic charge dissipator is made of extruded sheet material in flat form for use as a wall panel, counter top for a work station, floor pad or floor mat to dissipate static electricity. In a thermoformed state the dissipator can serve as a shipping container for storing and transporting electronic parts such as printed circuit boards.

The extruded sheet material preferably comprises a unitary combination of an electrically non-conductive thermoplastic substrate and conductive outer layers. The substrate is characterized by relatively high physical strength, particularly high melt strength, while the outer layers are of lesser strength because they include uniformly dispersed carbon particles. The layers are made of a compatible thermoplastic resin so that they can be fused onto opposite faces of the substrate.

If the flat sheet material is intended for use as a work station counter top, floor mat or wall panel the thin conductive outer layer is usually laminated onto only one of the substrate faces. In the thermoformed condition of the sheet material for use as a shipping container, a conductive outer layer is preferably laminated onto both faces of the substrate and conductive means such as a rivet are disposed through the layers and the substrate to provide an electrical path for discharging any static charge to the container exterior.

The stronger substrate is made relatively thick, and the conductive, less strong but more expensive outer layers are relatively thin. As a result, the overall thermoformability and strength of the laminate are essentially the same as that of the substrate alone. Further, the cost of such a conductive laminate is considerably less than the cost of making the substrate conductive through use of carbon inclusions.

The integral lamination or fusion of the conductive layer or layers to the substrate during or contemporaneously with extrusion of the substrate is an important feature of the invention. A preferred fusion method is coextrusion of the substrate and the layer or layers. A plurality of extruders are operated simultaneously to extrude the component laminations, and these are then fused together by pressure rollers or the like while they are still in a heated, nearly molten state.

A second method for fusing the laminations is a roll lamination process in which the thin outer layer or layers are rolled onto the freshly extruded substrate as it emerges from the extruder die at elevated temperatures.

Another method for fusing the components is press lamination in which the substrate and outer layer or layers are separately extruded and then pressed or fused together between press platens at elevated temperatures.

Adhesives may be used to enhance fusion if desired, but typically this is not necessary when resins of the fused components are compatible.

The flat sheet or thermoformed dissipators according to the present invention provide the desired electrostatic charge dissipation without any susceptibility of the electrically conductive material to wear, erosion or destruction over periods of extended use. The methods of the invention make fusion of the substrate and conductive layers relatively easy and inexpensive, producing structures whose strength is not adversely affected because of the conductive particle inclusions.

Other aspects and advantages of the present invention will become apparent from the following more detailed description taken in conjunction with the accompanying drawings.

BRIEF DESCRIPTION OF THE DRAWINGS

FIG. 4 is a perspective view of a thermoformed shipping container formed of laminated sheet material produced by one of the methods of FIGS. 1-3;

FIG. 5 is an enlarged view taken along the line 5—5 of FIG. 4;

FIGS. 6, 7 and 8 are enlarged detail views taken along the line 6—6 of FIG. 4 and illustrating various forms of electrical conductor which may be utilized to provide an electrical path between the conductive layers on the substrate;

FIG. 9 is a detail transverse section through the extruded sheet material, illustrating the use of different thicknesses of outer layers; and FIG. 10 is a perspective view of a dissipator in flat form.

DESCRIPTION OF THE PREFERRED EMBODIMENT

Figure 1:
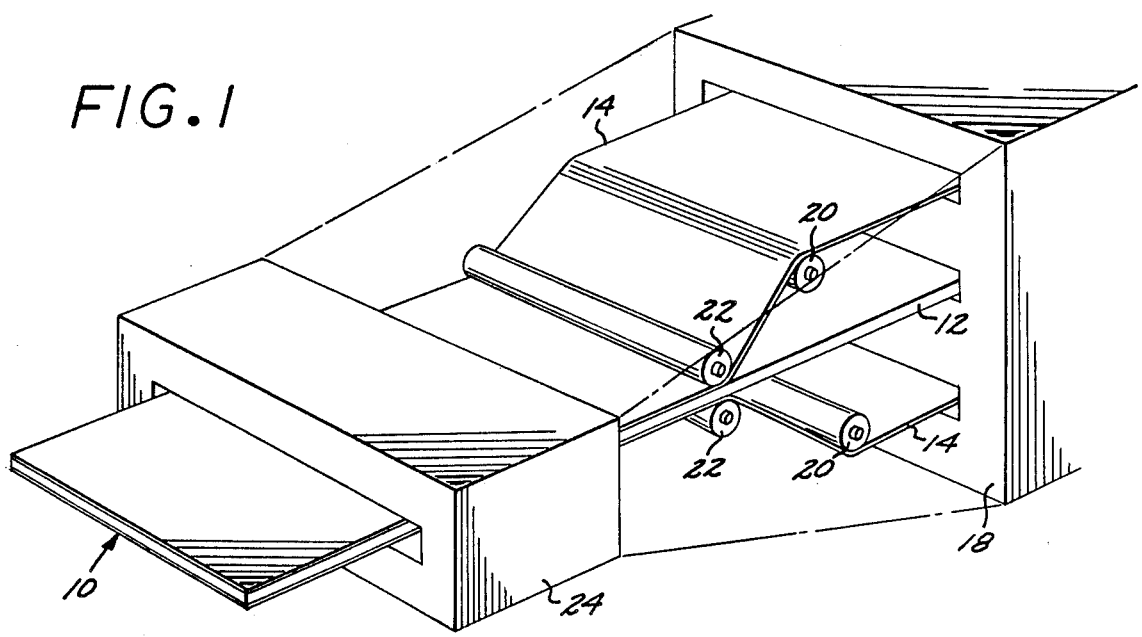
FIG. 1 is a schematic, perspective view of the extruded substrate being fused with outer conductive layers by coextrusion.
Figure 2:
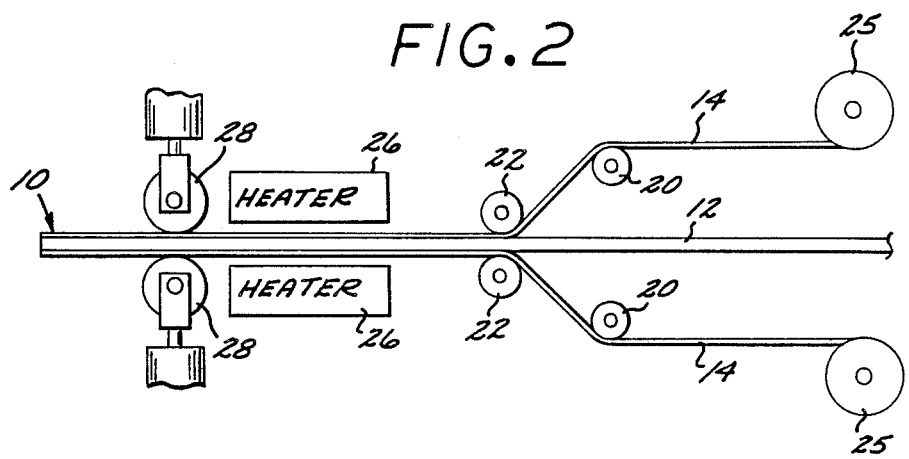
FIG. 2 is a schematic view of the substrate and outer layers being fused by rolling.
Figure 3:
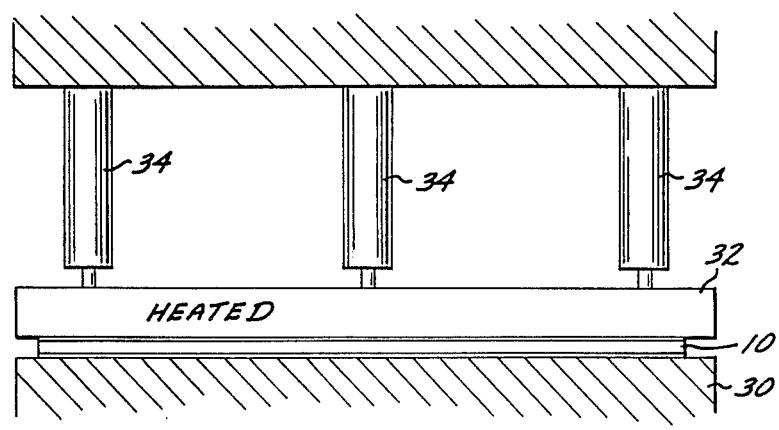
FIG. 3 is a schematic side elevational view of press lamination of the substrate and outer layers.

Referring now to FIGS. 1-3, three methods are schematically illustrated for fabricating sheet material 10 according to the present invention.

The material 10 comprises an inner layer or substrate 12 made of any suitable thermoplastic resin, such as high density polyethylene. It is readily available and is an ideal material because it is easily extruded and has high melt strength or minimum sag and excellent toughness. However, it also is characterized by electrical nonconductivity and a tendency to carry or support an electrostatic charge. To carry off such a charge the material 10 is provided with one or more outer layers 14 which are electrically conductive and compatible with the substrate in the sense that they can be heat fused to the substrate.

Conductive plastic formulations are well known in the prior art, usually incorporating a dispersion of electrically conductive particles, flakes or fibers, such as carbon particles in an amount sufficient to achieve the desired electrical conductivity.

Such a formulation is relatively costly, and the presence of the carbon adversely affects various mechanical properties of the material, including its melt strength and extrudability. It has been found that thermoforming such material provides erratic results in that there is a high incidence of defects in the thermoformed products. Consequently, it is impractical to make the entire sheet material 10 out of the resin-carbon formulation without experiencing problems in thermoforming the material.

The overall thickness of the sheet material 10 is dictated by the particular application for the final product, but in a typical application in which the material is thermoformed into a container 16, as seen in FIG. 4, the total wall thickness is approximately 400 thousanths of an inch. Of this, the substrate 12 is 300 thousandths of an inch thick to provide the necessary structural rigidity, while the outer layers 14 are each 50 thousandths of an inch thick. Each outer layer 14 must be sufficiently thick that it will not be stretched too thin during thermoforming or its electrical conductivity will be adversely affected.

The foregoing dimensions are merely exemplary and it will be apparent that various thicknesses of substrate and outer layer can be used depending upon the end application for the material 10.

The type and quantity of conductive material for incorporation in the material of the outer layers 14 should be selected such that the fusibility of the materials of the substrate and outer layers is not adversely affected.

By using the relatively thick substrate 12 and the relatively thin outer layers 14, a stronger container 16 can be more easily fabricated and at relatively low cost. This is important to reduce the costs of storing and shipping electronic components such as circuit boards or other items having static sensitive components.

The integral lamination or fusion of the respective layers of which the material 10 is comprised is preferably accomplished by contemporaneously extruding these layers and heat fusing them at an elevated temperature. With reference to FIG. 1, the numeral 18 generally denotes coextrusion apparatus well known in the prior art for heating and extruding the substrate 12 simultaneously with heating and extruding the outer layers 14.

The outer layers pass over idler rollers 20 and then beneath guide rollers 22 which guide the layers 14 onto the opposite surfaces of the substrate 12. The heated, nearly molten layers then pass through the fusion section 24 of the coextrusion apparatus to bring together the layers in a fused state. The fusion section 24 accomplishes this in such a way that the material of the faying surfaces of the three layers commingles and fuses, rendering the respective layers inseparable and incapable of being peeled apart.

FIG. 2 illustrates a second method for fusing the layers of the material 10. The outer layers pass from supply rollers 25, over the idler rollers 20, and then between the guide rollers 22. This brings the layers into intimate contact with the substrate, which is freshly extruded and in a near molten state.

Beyond the rollers 22, the joined layers are all heated to near melting temperature by a pair of suitable heaters 26. The heated layers then pass between pressure rollers 28 which forcibly compress them together until a state of fusion is achieved similar to that achieved by the method of FIG. 1.

FIG. 3 illustrates yet another method for fusing the laminations together. In this method the substrate and outer layers are separately extruded, partially cooled to provide structural integrity and then assembled with the outer layer 14 on opposite sides of the substrate. The assembled layers are next placed upon the lower platen 30 of a conventional hydraulic press. The upper and lower platens of the press are heated by integral heaters or the like (not shown). It is urged forcibly against the assembled layers by hydraulic cylinders or rams 34 such that the combination of heat and pressure achieves fusion of the layers in a manner analogous to that of the methods of FIGS. 1 and 2.

The fused sheet material can be cut into suitable sizes for use as a work station counter top, wall panel or as a floor mat under the chair of a computer operator, for example, to carry off static electricity. For this purpose a suitably grounded electrical lead (not shown) could be attached to a conductor such as a rivet 34, as seen in FIG. 10, which extends through all layers of the material. In some instances the rivet could be omitted if the sheet material rests upon a suitably grounded surface.

FIG. 6 illustrates a typical rivet 34 for this purpose. FIG. 7 illustrates another configuration of rivet 34a, while FIG. 8 illustrates a river 34b which is molded from the same electrically conductive material as the outer layers 14.

FIG. 9 illustrates a sheet 10a which is like sheet material 10 except that the outer layers 14a are of different thicknesses. This is useful in certain applications in which a higher capacity electrical path is required on one surface of the substrate 12 compared to the other.

Although the preferred embodiment of the material 10 includes a pair of outer layers 14, one on each of the opposite faces of the substrate, use of the sheet 10 in flat form makes possible the use of one layer 14. This reduces the cost of the mat or panel and the single outer layer 14 is sufficient to provide an adequate electrical path for static discharge.

The container 16 illustrated in FIG. 4 is thermoformed out of sheet material 10 using well known vacuum forming or other techniques for integrally including strengthening corrugations, channels or ribs 36 in the container walls.

The container 16 includes a bottom and side and end walls. A removable top (not shown) can be used to close the container to suit it for the containment and shipment of such electronic components as printed circuit boards and the like. One container end wall incorporates one or more electrical conductors or rivets 34. These could be connected by suitable electrical leads (not shown) to any grounded conductive element or surface, but normally the container would simply rest upon such a surface. Static charges are thus carried away before they can harm any of the electronic components in the container.

From the foregoing it will be seen that various relatively inexpensive methods have been disclosed for fabricating sheet material for use in flat form to carry off static charges building up in a floor or wall adjacent sensitive electronic equipment or components, or for thermoforming into containers useful for storing and shipping electronic components.

The combination of the relatively thick substrate 12 and the thin electrically conductive outer layers 14 provides a structurally rugged container which is characterized by the desired electrical conductivity, but without the high cost and impaired mechanical properties usually associated with electrically conductive containers. The use of the electrical conductor through the substrate and the outer layers effectively makes the laminate as electrically conductive as if it were made of a single material impregnated with carbon inclusions.

Various modifications and changes may be made with regard to the foregoing detailed description without departing from the spirit of the invention.

I claim:

1. Extruded sheet material for draining off an electrostatic charge comprising:
    a substrate made of electrically non-conductive resin;
    a relatively thin layer fused to at least one of the opposite faces of the substrate, the layer being made of a resin having electro-conductive inclusions dispersed throughout the resin; and
    an electrical conductor coupled to the layer for dissipating any electrostatic charge.

2. Extruded sheet material according to claim 1 wherein the inclusions are carbon particles.

3. Extruded sheet material according to claim 1 wherein the resin of the substrate is a high density polyethylene and the resin of the layer is of a type which is heat fusible to the sheet.

4. Extruded sheet material according to claim 1 wherein the substrate has a relatively high melt strength to facilitate thermoforming of the sheet material into a shipping container.

5. Extruded sheet material according to claim 1 wherein the layer is laminated onto both of the opposite faces of the substrate, and the electrical conductor is coupled to both of the layers on such opposite faces.

6. A shipping container for holding an article susceptible to damage by an electrostatic charge, the container comprising:
    a plurality of thermoformed walls made of extruded sheet material defining a hollow interior for receiving the article, the sheet material including a substrate made of electrically non-conductive thermoplastic resin, and further including a relatively thin layer laminated onto at least one of the opposite faces of the substrate, the layer being made of a thermoplastic resin having electrically conductive inclusions dispersed throughout the resin; and
    an electrical conductor coupled to the layer for dissipating any electrostatic charge.

7. Extruded sheet material according to claim 6 wherein the inclusions are carbon particles.

8. Extruded sheet material according to claim 6 wherein the resin of the substrate is a high density polyethylene and the resin of the layer is of a type which is heat fusible to the sheet.

9. Extruded sheet material according to claim 6 wherein the layer is laminated onto both of the opposite faces of the substrate, and the electrical conductor is coupled to both of the layers on such opposite faces

* * * * *